(12) United States Patent
Maxim et al.

(10) Patent No.: US 10,277,222 B1
(45) Date of Patent: Apr. 30, 2019

(54) RADIO FREQUENCY SWITCH

(71) Applicant: Qorvo US, Inc., Greensboro, NC (US)

(72) Inventors: George Maxim, Saratoga, CA (US);
Baker Scott, San Jose, CA (US);
Marcus Granger-Jones, Scotts Valley, CA (US); Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/907,631

(22) Filed: Feb. 28, 2018

(51) Int. Cl.
*H03K 17/16* (2006.01)
*H04B 1/40* (2015.01)
*H03K 3/012* (2006.01)
*H03K 17/687* (2006.01)

(52) U.S. Cl.
CPC ......... *H03K 17/161* (2013.01); *H03K 17/687* (2013.01); *H04B 1/40* (2013.01)

(58) Field of Classification Search
CPC ....... H03K 17/161; H03K 17/687; H04B 1/40
See application file for complete search history.

(56) References Cited

U.S. PATENT DOCUMENTS

| | | | |
|---|---|---|---|
| 5,661,414 A | 8/1997 | Shigehara et al. | |
| 5,689,144 A | 11/1997 | Williams | |
| 5,880,620 A | 3/1999 | Gitlin et al. | |
| 5,973,364 A | 10/1999 | Kawanaka | |
| 6,191,615 B1 | 2/2001 | Koga | |
| 8,729,948 B2 | 5/2014 | Sugiura | |
| 9,013,225 B2* | 4/2015 | Madan | H03K 17/162 327/379 |
| 9,048,836 B2 | 6/2015 | Maxim et al. | |
| 9,628,075 B2* | 4/2017 | Cebi | H03K 17/687 |
| 10,044,349 B2 | 8/2018 | Scott et al. | |
| 2002/0057139 A1 | 5/2002 | Matsumura et al. | |
| 2002/0079544 A1 | 6/2002 | Shino | |
| 2003/0085777 A1 | 5/2003 | Kim et al. | |
| 2005/0195063 A1 | 9/2005 | Mattsson | |
| 2006/0220727 A1 | 10/2006 | Yen | |
| 2007/0018247 A1 | 1/2007 | Brindle et al. | |
| 2008/0237677 A1 | 10/2008 | Futatsugi | |
| 2011/0163824 A1 | 7/2011 | Kawano | |

(Continued)

FOREIGN PATENT DOCUMENTS

| | | |
|---|---|---|
| EP | 1184977 A2 | 3/2002 |
| WO | 2005117255 A1 | 12/2005 |

OTHER PUBLICATIONS

Ex Parte Quayle Action for U.S. Appl. No. 15/494,605, dated Jun. 15, 2018, 5 pages.

(Continued)

*Primary Examiner* — Kenneth B Wells
(74) *Attorney, Agent, or Firm* — Withrow & Terranova, P.L.L.C.

(57) ABSTRACT

A radio frequency switch having a first node, a second node, and a plurality of switch cells that are coupled in series between the first node and the second node is disclosed. Each of the plurality of switch cells includes a field-effect transistor having a drain terminal, a source terminal, a FET gate terminal, and a body terminal and an off-state linearization network. The off-state linearization network includes varactors coupled to the drain terminal and the source terminal of the field-effect transistor.

17 Claims, 10 Drawing Sheets

(56) References Cited

U.S. PATENT DOCUMENTS

| | | |
|---|---|---|
| 2012/0081192 A1 | 4/2012 | Hanaoka |
| 2012/0146149 A1 | 6/2012 | Momiyama |
| 2013/0299890 A1 | 11/2013 | Oh et al. |
| 2015/0035582 A1 | 2/2015 | Maxim et al. |
| 2015/0155278 A1 | 6/2015 | Seo et al. |
| 2015/0341026 A1* | 11/2015 | de Jongh .............. H03K 17/161 327/382 |

OTHER PUBLICATIONS

Notice of Allowance and Examiner-Initiated Interview Summary for U.S. Appl. No. 15/494,605, dated Sep. 10, 2018, 9 pages.

Hoppenjans, Eric E. et al., "A Vertically Integrated Tunable UHF Filter," International Microwave Symposium Digest (MTT), May 23-28, 2010, Anaheim, California, IEEE, pp. 1380-1383.

Joshi, H. et al., "Tunable high Q narrow-band triplexer," IEEE MTT-S International Microwave Symposium Digest, Jun. 7-12, 2009, Boston, MA, IEEE, pp. 1477-1480.

Kamali-Sarvestani, Reza et al., "Fabrication of High Quality Factor RF-Resonator Using Embedded Inductor and via Capacitor," IECON 2010—36th Annual Conference on IEEE Industrial Electronics Society, Nov. 7-10, 2010, Glendale, Arizona, IEEE, pp. 2283-2287.

International Search Report and Written Opinion for PCT/US2014/030431, dated Jun. 20, 2014, 14 pages.

Non-Final Office Action for U.S. Appl. No. 14/449,594, dated Oct. 10, 2014, 8 pages.

Notice of Allowance for U.S. Appl. No. 14/449,594, dated Feb. 4, 2015, 6 pages.

Ex Parte Quayle Action for U.S. Appl. No. 15/494,605, mailed Jun. 1, 2018, 5 pages.

Notice of Allowance for U.S. Appl. No. 15/939,625, dated Nov. 27, 2018, 7 pages.

* cited by examiner

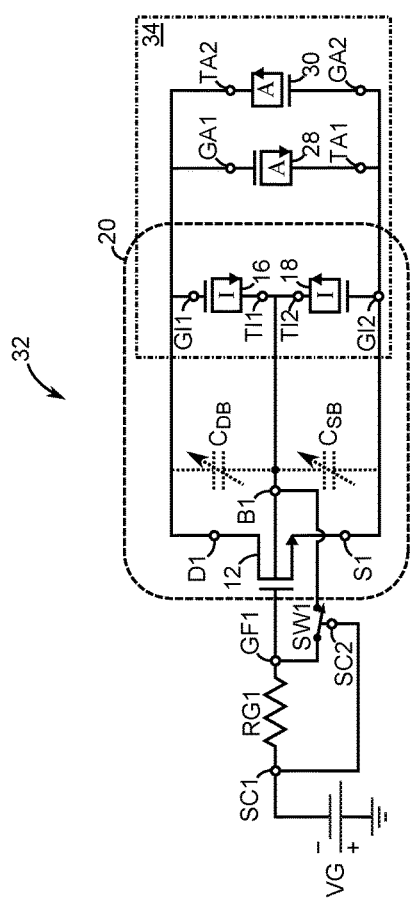
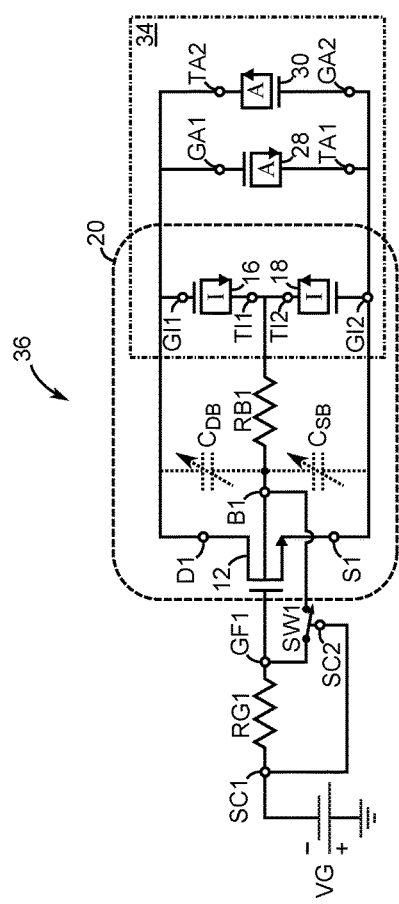
FIG. 4
FIG. 5

RADIO FREQUENCY SWITCH

RELATED APPLICATIONS

This application is related to U.S. patent application Ser. No. 15/494,605, filed Apr. 24, 2017, now U.S. Pat. No. 10,181,478, titled ELECTRONIC COMPONENT HAVING FIELD EFFECT TRANSISTOR CELLS, which claims priority to U.S. provisional application Ser. No. 62/443,047, filed Jan. 6, 2017, the disclosures of which are hereby incorporated herein by reference in their entireties.

FIELD OF THE DISCLOSURE

Embodiments of the present disclosure relate to radio frequency switching circuitry.

BACKGROUND

An important electronic component of a radio frequency (RF) transceiver is a field-effect transistor (FET) that makes up stacked FET-type RF switches. An RF switch that is FET based typically needs linearity compensation to prevent generation of harmonic distortion when transmit signals are applied to the RF switch while the RF switch is in an off-state. The RF switch is effectively open while in the off-state, and the transmit signals are prevented from passing through the RF switch. However, while the RF switch is open, undesirable harmonics are generated from the transmit signals in part due to non-linear capacitance inherent to the RF switch. The undesirable harmonics pass from the RF switch and interfere with the RF transceiver's receiver circuitry.

A traditional off-state linearization network is placed in parallel with the RF switch to reduce the undesirable harmonics. While the traditional off-state linearization network does reduce the harmonic distortion when transmit signals are applied to the RF switch in the off-state, the traditional off-state linearization network takes up valuable circuit real estate because it requires external bias circuitry. What is needed to regain valuable real estate are off-state linearization networks that do not require external bias circuitry.

SUMMARY

A radio frequency switch having a first node, a second node, and a plurality of switch cells that are coupled in series between the first node and the second node is disclosed. Each of the plurality of switch cells includes a field-effect transistor having a drain terminal, a source terminal, a field-effect transistor gate terminal, and a body terminal and an off-state linearization network. The off-state linearization network includes varactors coupled to the drain terminal and the source terminal of the field-effect transistor.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 4 is an embodiment of a hybrid RF switch cell that combines the inversion-mode varactor-based linearization network (FIGS. 1 and 2) with the accumulation-mode varactor-based linearization network (FIG. 3) to yield a hybrid linearization network.

FIG. 5 is an embodiment of a hybrid RF switch cell that includes the hybrid linearization network of FIG. 4 and the body resistor.

DETAILED DESCRIPTION

Figure 1:
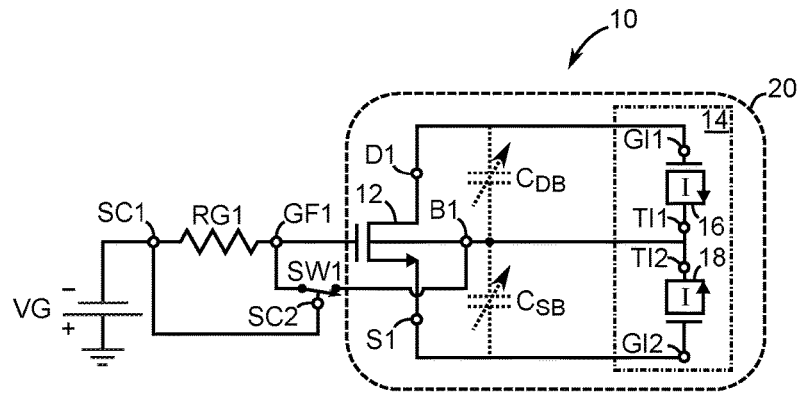
FIG. 1 is a schematic depicting an embodiment of an inversion-mode varactor version of a radio frequency (RF) switch cell structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure includes embodiments of a radio frequency switch that uses either accumulation-mode varactors or inversion-mode varactors or combinations of both to reduce undesired harmonics generated by the radio frequency switch when a radio frequency signal is applied across the radio frequency switch in an off-state. Exemplary embodiments of the accumulation-mode varactors and inversion-mode varactors are fabricated with negative metal oxide semiconductor (NMOS) structures. A structural difference between an NMOS-type accumulation-mode varactor and an NMOS-type inversion-mode varactor is an N-well in the channel between the source and the drain of the NMOS-type accumulation-mode varactor. NMOS-type inversion-mode varactors do not have the N-well and in some exemplary embodiments can be fabricated to share body diffusions of field-effect transistors making up the RF switch. Behaviorally, a total capacitance of an accumulation-mode varactor generally transitions from a smaller value to a larger value as tuning voltage is transitioned from a more positive voltage region to a more negative voltage region. In contrast, the total capacitance of an inversion-mode varactor generally transitions from a larger value to a smaller value as tuning voltage is transitioned from the more positive voltage region to the more negative voltage region.

FIG. 1 is a schematic depicting a first embodiment of a radio frequency (RF) switch cell 10 structured in accordance with the present disclosure. The RF switch cell 10 includes a field-effect transistor (FET) 12 having a drain terminal D1, a source terminal S1, a FET gate terminal GF1, and a body terminal B1. The RF switch cell 10 further includes an off-state linearization network 14 that reduces undesirable harmonics that are generated from RF signals applied across the RF switch cell 10 when the FET 12 is in an off-state that blocks the RF signals from passing between the drain terminal D1 and the source terminal S1. The undesirable harmonics are generated in part due to parasitic non-linear capacitances inherent in the RF switch cell 10. The parasitic non-linear capacitances are attributable at least in part to drain-body and source-body diodes (not shown) of the FET 12.

In FIG. 1, the parasitic non-linear capacitances are symbolically represented in dashed line as a drain-to-body capacitor $C_{DB}$ and a source-to-body capacitor $C_{SB}$. The off-state linearization network 14 includes a first inversion-mode varactor 16 to counter undesirable harmonics due to the drain-to-body capacitor $C_{DB}$. The first inversion-mode varactor 16 has a first varactor gate terminal GI1 coupled to the drain terminal D1 and a first tuning terminal TI1 coupled to the body terminal B1. A second inversion-mode varactor 18 is included to counter undesirable harmonics due to the source-to-body capacitor $C_{SB}$. The second inversion-mode varactor 18 has a second varactor gate terminal GI2 coupled to the source terminal S1 and a second tuning terminal TI2 coupled to the body terminal B1.

The letter "I" in the varactor symbols representing the first inversion-mode varactor 16 and the second inversion-mode varactor 18 signifies inversion-mode operation that allows the first inversion-mode varactor 16 and the second inversion-mode varactor 18 to be tuned without need of an external bias network. Instead, the first inversion-mode varactor 16 and the second inversion-mode varactor 18 are tuned by gate voltage VG that places the FET 12 in the off-state. The gate voltage VG is applied to the gate of the FET 12 at a first control terminal SC1. A gate resistor RG1 may be coupled between the first control terminal SC1 and the FET gate terminal GF1.

The gate voltage VG is applied to the body terminal B1, the first tuning terminal TI1, and the second tuning terminal TI2 through a gate-body switch SW1 that is coupled between FET gate terminal GF1 and the body terminal B1. A second control terminal SC2 for control of the gate-body switch SW1 is coupled to the first control terminal SC1. The gate-body switch SW1 is configured to close when the gate voltage VG is at a level that maintains the FET 12 in the off-state and open when the gate voltage VG is at a level that maintains the FET 12 in an on-state that passes RF signals between the drain terminal D1 and the source terminal S1. An exemplary voltage level for VG to maintain the FET 12 in the off-state is −2.5 V. The FET 12 of FIG. 1 is depicted in the off-state. As such, the gate voltage VG is shown as being negative with respect to ground, and the gate-body switch SW1 is depicted in its closed state to apply the gate voltage VG at a negative level to the body terminal B1, the first tuning terminal TI1, and the second tuning terminal TI2. Therefore, FIG. 1 depicts an instant configuration for the RF switch cell 10 in which the first inversion-mode varactor 16 counters undesirable harmonics due to the drain-to-body capacitor $C_{DB}$ and the second inversion-mode varactor 18 counters undesirable harmonics due to the source-to-body capacitor $C_{SB}$. In the exemplary embodiment of FIG. 1, the first inversion-mode varactor 16 and the second inversion-mode varactor 18 are fabricated such that they share a body diffusion 20 with the FET 12. The body diffusion 20 is represented symbolically with a dashed rectangle with rounded edges.

Figure 2:
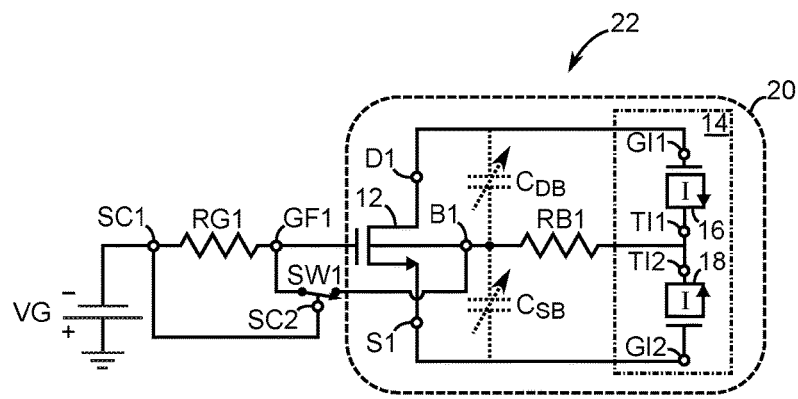
FIG. 2 is a schematic depicting another embodiment of the RF switch cell that includes a body resistor that provides increased linearization at some power levels.

FIG. 2 is a schematic depicting a second embodiment of an RF switch cell 22 that includes a body resistor RB1 coupled between the body terminal B1 and the first tuning terminal TI1 and the second tuning terminal TI2. The body resistor RB1 provides an isolation resistance and increased linearization. As shown in FIG. 2, the body resistor RB1 can share the body diffusion 20.

Figure 3:
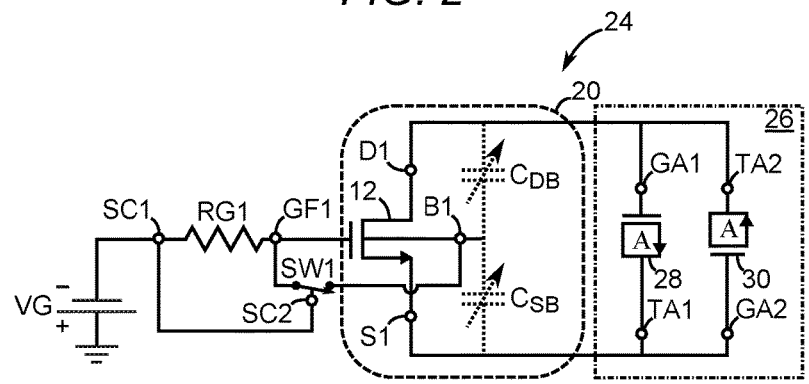
FIG. 3 is a schematic depicting an accumulation-mode varactor version of an RF switch cell.

FIG. 3 is a schematic of an RF switch cell 24 that includes an off-state linearization network 26 that in accordance with the present disclosure is structured differently than the off-state linearization network 14 of FIGS. 1 and 2. In this case, the off-state linearization network 26 includes a first accumulation-mode varactor 28 and a second accumulation-mode varactor 30 that are arranged in an anti-parallel configuration. The letter "A" in the varactor symbols representing the first accumulation-mode varactor 28 and the second accumulation-mode varactor 30 signifies accumulation-mode operation.

In greater detail, the first accumulation-mode varactor 28 has a first varactor gate terminal GA1 coupled to the drain terminal D1 and a first tuning terminal TA1 coupled to the source terminal S1. The second accumulation-mode varactor 30 has a second varactor gate terminal GA2 coupled to the source terminal S1 and a second tuning terminal TA2 coupled to the drain terminal D1. Similar to the operation of the embodiments of FIG. 1 and FIG. 2, the gate-body switch SW1 is configured to automatically open when the FET 12 transitions to an on-state that passes an RF signal between the drain terminal D1 and the source terminal S1 and is further configured to automatically close when the FET 12 transitions to an off-state that blocks passage of the RF signal between the drain terminal D1 and the source terminal S1.

The first accumulation-mode varactor 28 and the second accumulation-mode varactor 30 are each a tenth of the size of traditional accumulation-mode varactors used to linearize RF switches in the off-state. As such, no figure of merit for an RF switch constructed of a plurality of RF switch cells 24 is negatively affected. For comparison, a traditional off-state linearization network causes an 8% to 10% degradation in figure of merit. An exemplary size for first accumulation-mode varactor 28 and the second accumulation-mode varactor 30 is 2 microns square.

FIG. 4 is an embodiment of an RF switch cell 32 that combines the inversion-mode varactor-based version of the off-state linearization network 14 (FIGS. 1 and 2) with the accumulation-mode varactor-based version of the off-state linearization network 26 (FIG. 3) to yield a hybrid linearization network 34. In this exemplary embodiment, the first inversion-mode varactor 16 and the second inversion-mode varactor 18 are fabricated such that they share the body diffusion 20 with the FET 12, whereas the first accumulation-mode varactor 28 and the second accumulation-mode varactor 30 do not share the body diffusion 20.

FIG. 5 is an embodiment of an RF switch cell 36 that includes the hybrid linearization network 34 along with the body resistor RB1. In this exemplary embodiment, the body resistor RB1 shares the body diffusion 20 with the FET 12 and the first inversion-mode varactor 16 and the second inversion-mode varactor 18. The body resistor RB1 provides an isolation resistance and increased linearization. An exemplary resistance value for the body resistor RB1 is 10,000Ω.

Figure 6:
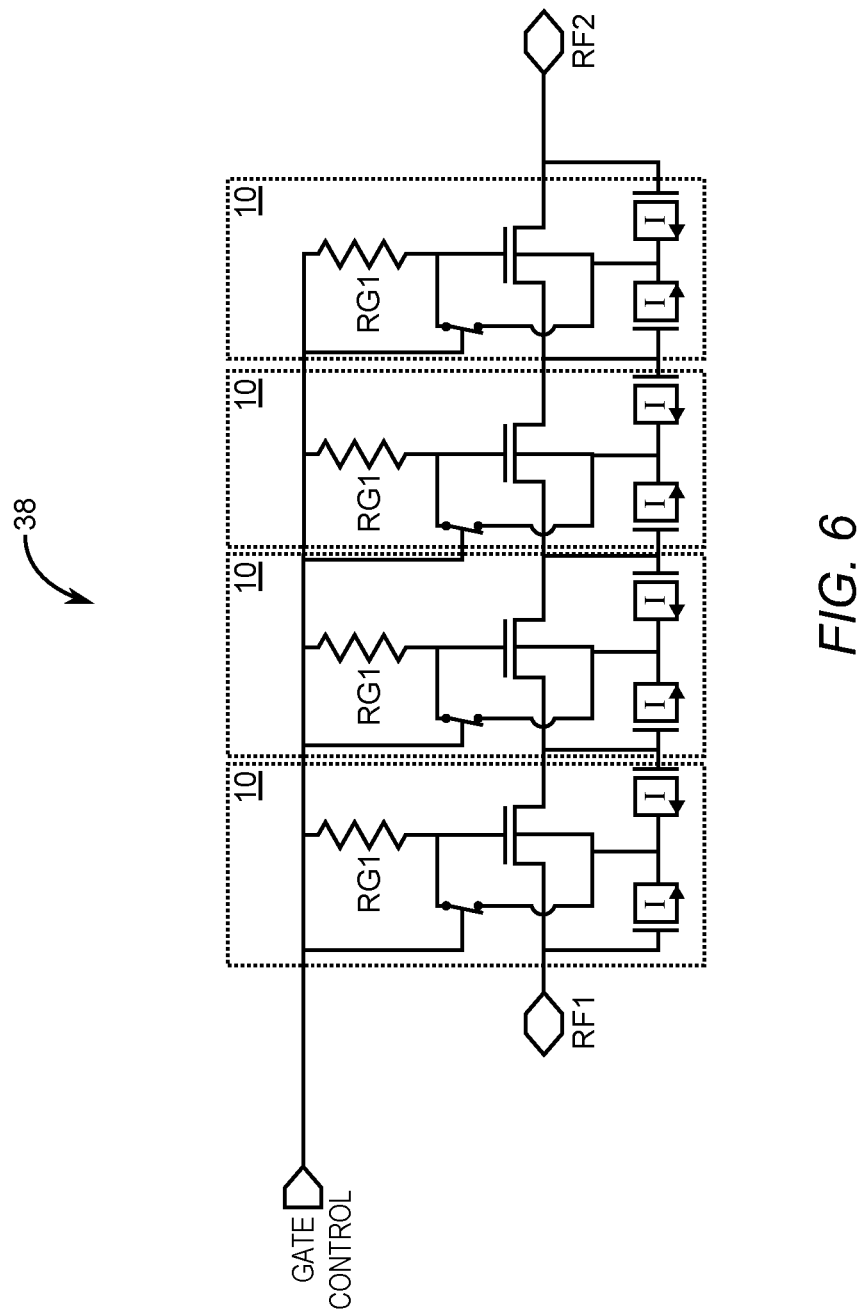
FIG. 6 is a schematic of an inversion-mode varactor version of an RF switch made up of a plurality of the RF switch cells depicted in FIG. 1.

FIG. 6 is a schematic of an inversion-mode varactor version of an RF switch 38 having a first node RF1, a second node RF2, and a plurality of the RF switch cells 10 depicted in FIG. 1. The RF switch cells 10 are coupled in series from the source terminal S1 to the drain terminal D1 between the first node RF1 and the second node RF2. A gate control terminal receives the gate voltage VG (FIGS. 1-5) to transition and/or maintain the RF switch 38 between the on-state and the off-state.

Figure 7:
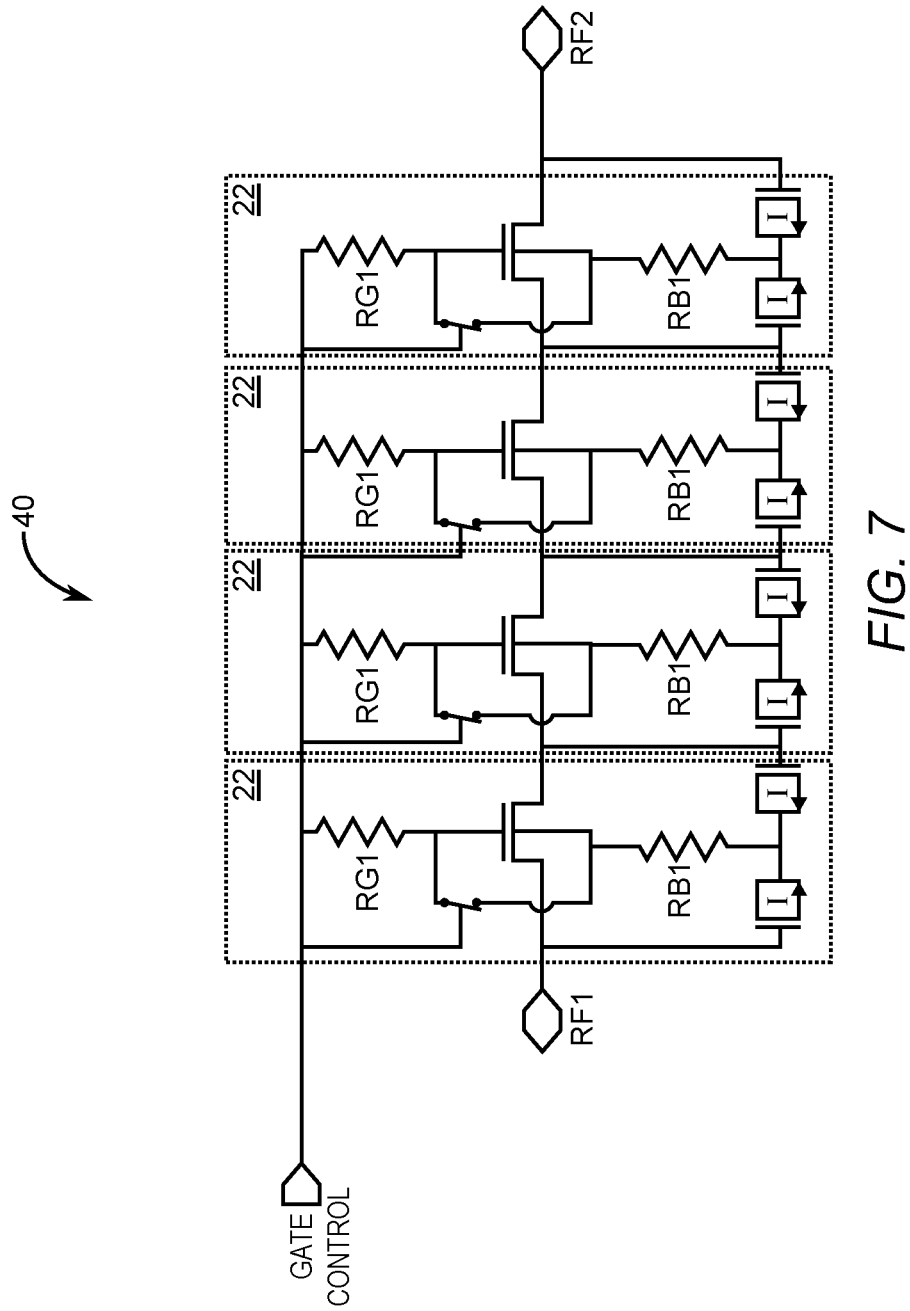
FIG. 7 is a schematic of an inversion-mode varactor version of an RF switch made up of a plurality of the RF switch cells depicted in FIG. 2.

FIG. 7 is a schematic of an inversion-mode varactor version of an RF switch 40 made up of a plurality of the RF switch cells 22 depicted in FIG. 2. The RF switch cells 22 are coupled in series from the source terminal S1 to the drain terminal D1 between the first node RF1 and the second node RF2. A difference between the RF switch 38 and the RF switch 40 is the body resistor RB1 that is included with each of the RF switch cells 22.

Figure 8:
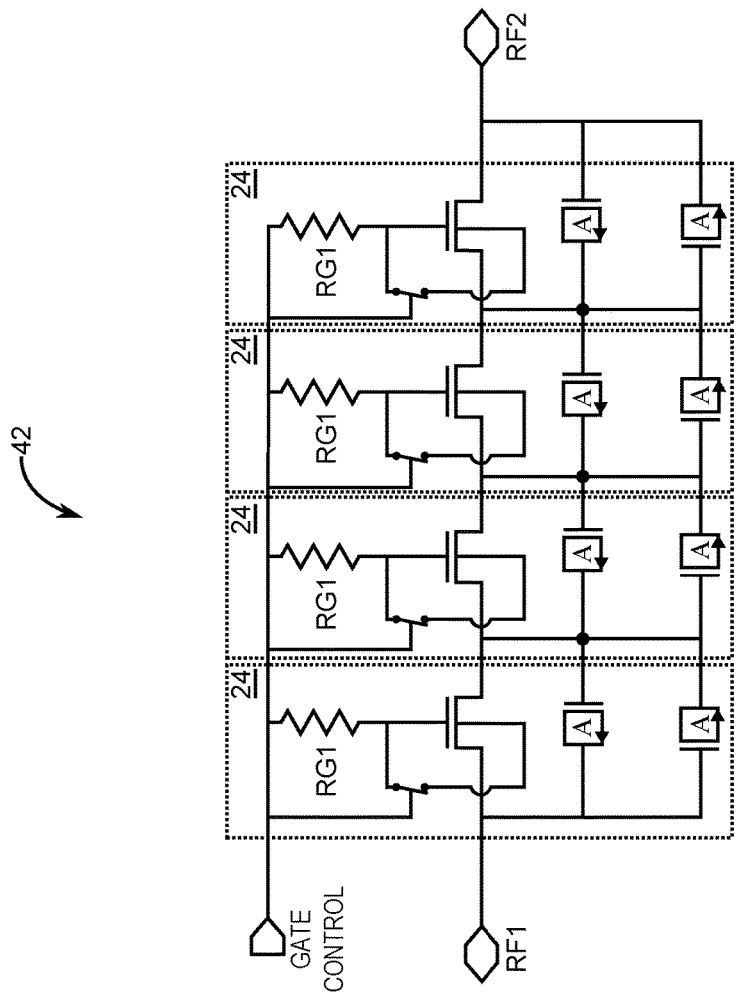
FIG. 8 is a schematic of an accumulation-mode varactor version of an RF switch made up of a plurality of the RF switch cells depicted in FIG. 3.

FIG. 8 is a schematic of an accumulation-mode varactor version of an RF switch 42 made up of a plurality of the RF switch cells 24 depicted in FIG. 3. The RF switch cells 24 are coupled in series from the source terminal S1 to the drain terminal D1 between the first node RF1 and the second node RF2.

Figure 9:
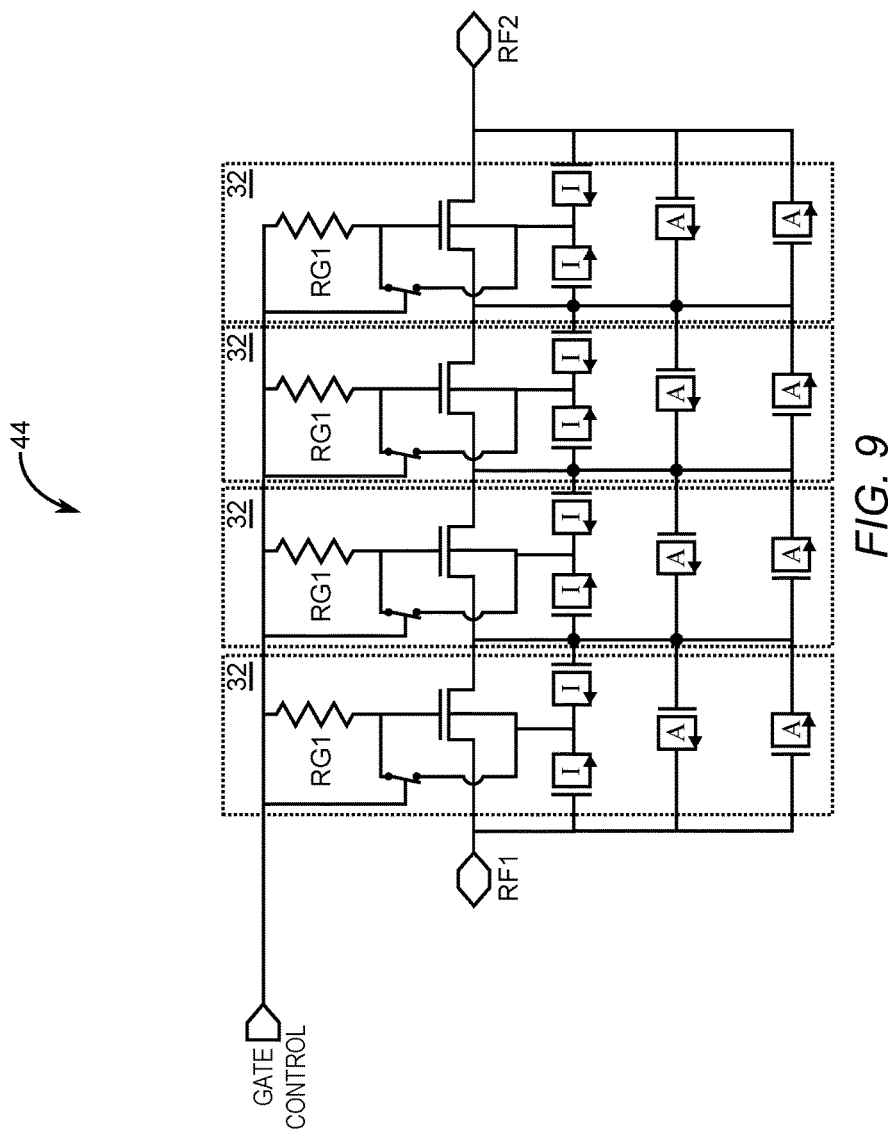
FIG. 9 is a schematic of a hybrid version of an RF switch made up of a plurality of the RF switch cells depicted in FIG. 4.

FIG. 9 is a schematic of a hybrid version of an RF switch 44 made up of a plurality of the RF switch cells 32 depicted in FIG. 4. In this exemplary embodiment, the RF switch cells 32 combine attributes of inversion-mode varactor operation and accumulation-mode varactor operation for increased linearization of the RF switch 44 over the previous embodiments for particular RF signal amplitude ranges. The RF switch cells 32 are coupled in series from the source terminal S1 to the drain terminal D1 between the first node RF1 and the second node RF2.

Figure 10:
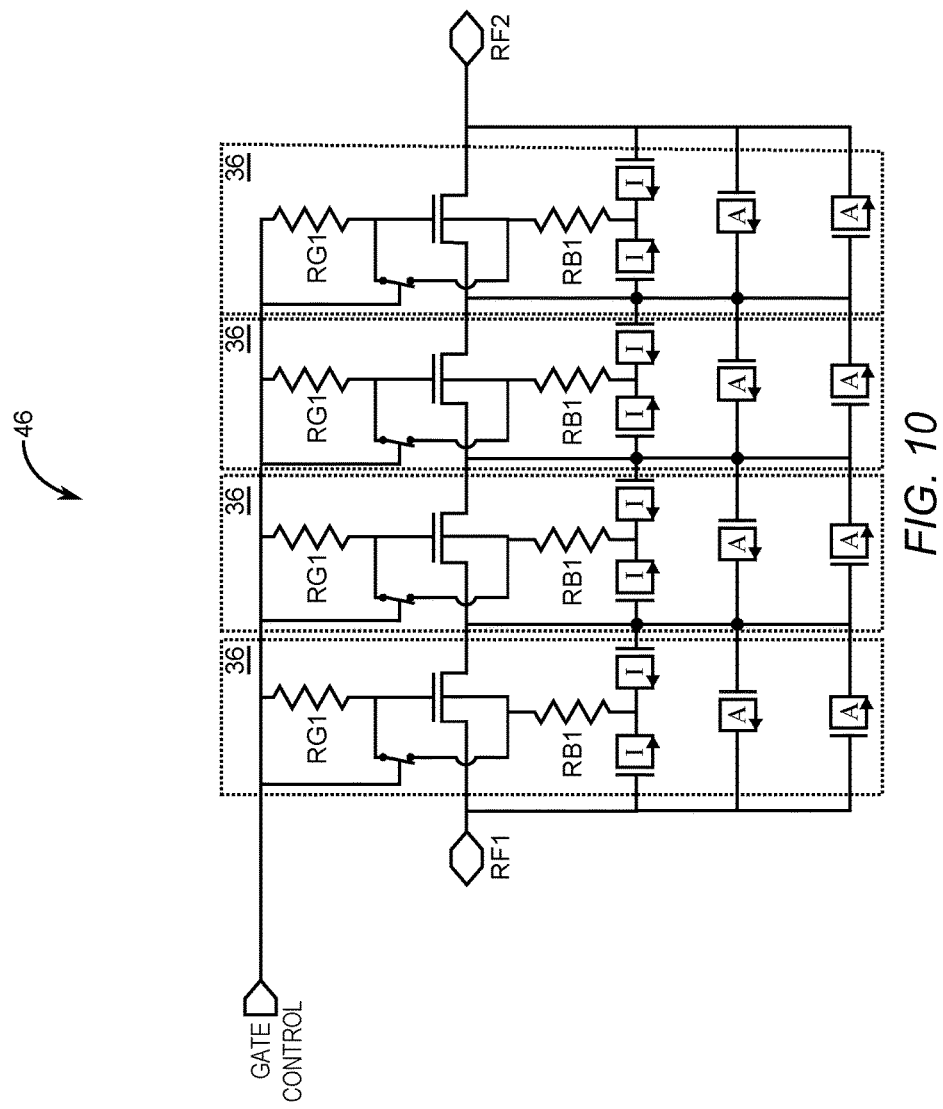
FIG. 10 is a schematic of a hybrid version of an RF switch made up of a plurality of the RF switch cells depicted in FIG. 5.

FIG. 10 is a schematic of a hybrid version of an RF switch 46 made up of a plurality of the RF switch cells 36 depicted in FIG. 5. A difference between the RF switch 46 and the RF switch 38 is the body resistor RB1 that is included with each of the RF switch cells 36.

Figure 11:
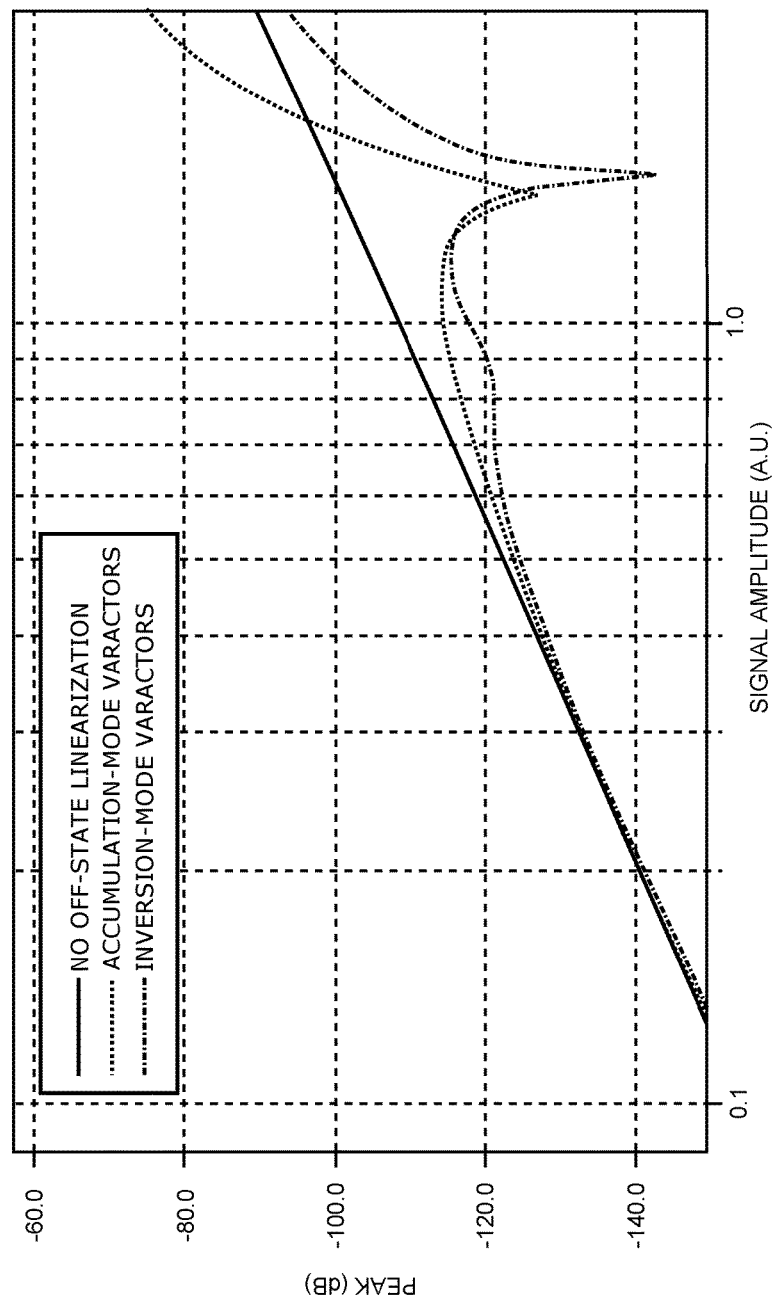
FIG. 11 is a graph of peak harmonic distortion versus signal amplitude comparing an RF switch having no off-state linearization with an RF switch having accumulation-mode varactor off-state linearization and an RF switch having inversion-mode varactor off-state linearization.

FIG. 11 is a graph of peak harmonic distortion versus signal amplitude comparing an RF switch having no off-state linearization with an RF switch having accumulation-mode varactor off-state linearization and an RF switch having inversion-mode varactor off-state linearization. Performance of the RF switch 42 (FIG. 8) having accumulation-mode off-state linearization only is plotted in dashed line. The accumulation-mode off-state linearization of the RF switch 42 is superior over a traditional RF switch with no off-state linearization with the exception of a higher voltage region after a notch at which maximum linearization occurs.

Figure 12:
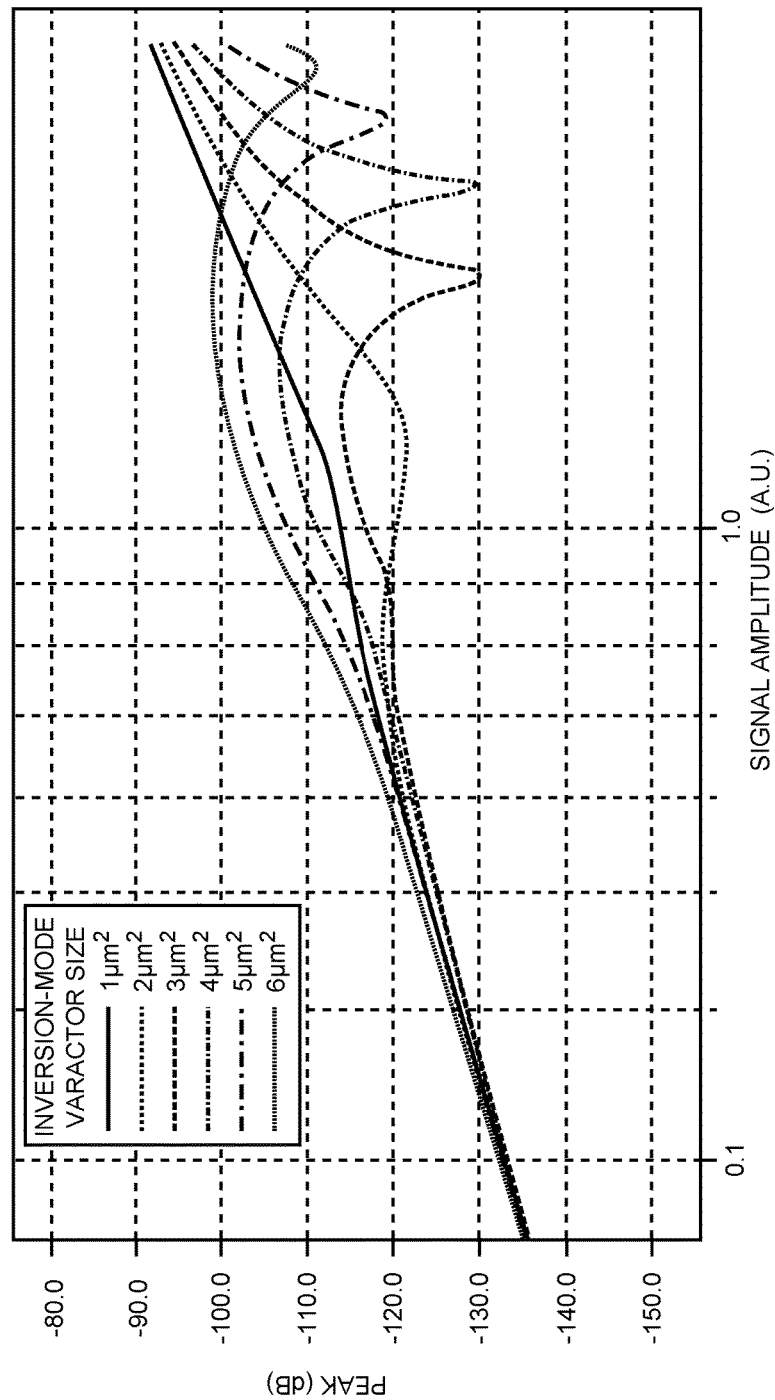
FIG. 12 is a graph of peak harmonic distortion versus signal amplitude comparing off-state linearization performance of different sizes of inversion-mode varactors.

Performance of the RF switch 44 (FIG. 9) having inversion-mode off-state linearization only is plotted in dot-dash line. The inversion-mode off-state linearization of the RF switch 44 is superior over a traditional RF switch with no off-state linearization over a larger signal voltage range than that of the RF switch 42. Even after a notch at which maximum linearization occurs, the inversion-mode off-state linearization of the RF switch 44 is superior over a traditional RF switch. However, it is to be understood that the performance depicted in FIG. 11 is exemplary and that greater linearization performance is envisioned for RF switches having different dimensions and fabrication processes. In this regard, FIG. 12 is a graph of peak harmonic distortion versus signal amplitude comparing off-state linearization performance of different sizes of inversion-mode varactors.

Figure 13:
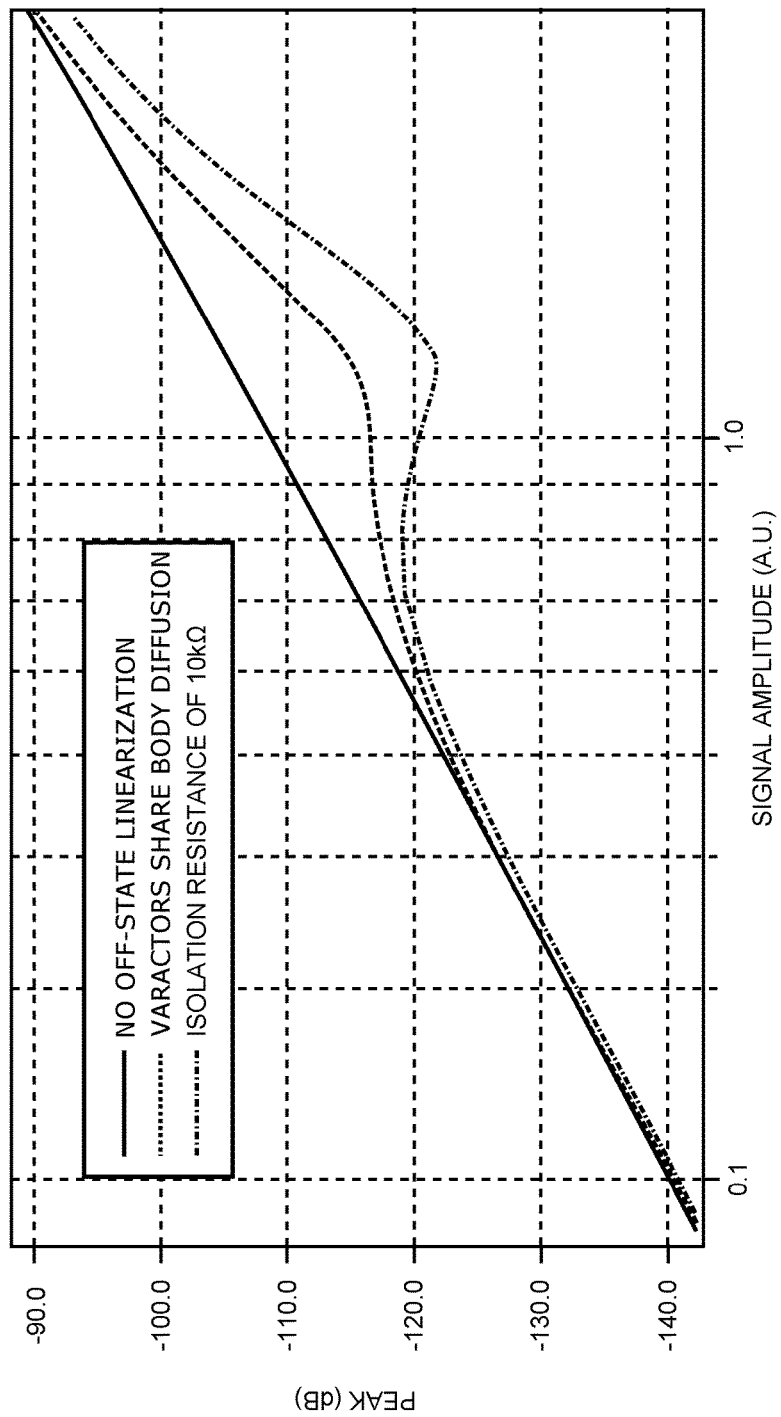
FIG. 13 is a graph of peak harmonic distortion versus signal amplitude comparing off-state linearization performance of having no off-state linearization, inversion-varactors that share a body diffusion, and inversion varactors coupled to the body terminal through an isolation resistance.

FIG. 13 is a graph of peak harmonic distortion versus signal amplitude comparing off-state linearization performance of having no off-state linearization, inversion-varactors that share a body diffusion, and tuning terminals of varactors are coupled to a body terminal through an isolation resistance. In particular, the graph of FIG. 13 illustrates enhanced linearization of the RF switch cell 10 of FIG. 1 and even greater linearization provided by the RF switch cell 22 of FIG. 2. The isolation of 10 kΩ is provided by the body resistor RB1 (FIG. 2), which can be a well-type resistor.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency switch comprising a first node, a second node, and a plurality of switch cells that are coupled in series between the first node and the second node wherein each of the plurality of switch cells comprises:
   a field-effect transistor (FET) comprising a drain terminal, a source terminal, a FET gate terminal, and a body terminal; and
   an off-state linearization network comprising:
      a first inversion-mode varactor having a first varactor gate terminal coupled to the drain terminal and a first tuning terminal coupled to the body terminal;
      a second inversion-mode varactor having a second varactor gate terminal coupled to the source terminal and a second tuning terminal coupled to the body terminal; and
      a gate-body switch coupled between the FET gate terminal and the body terminal, wherein the gate-body switch is configured to automatically open when the FET transitions to an on-state that passes a radio frequency signal between the drain terminal and the source terminal and is further configured to automatically close when the FET transitions to an off-state that blocks passage of the radio frequency signal between the drain terminal and the source terminal.

2. The radio frequency switch of claim 1 wherein the FET, the first inversion-mode varactor, and the second inversion-mode varactor include a shared body diffusion.

3. The radio frequency switch of claim 1 wherein the first tuning terminal and the second tuning terminal are coupled directly to the body terminal.

4. The radio frequency switch of claim 1 further including a body resistor that couples the first tuning terminal and the second tuning terminal to the body terminal.

5. The radio frequency switch of claim 1 further including a body resistor that shares a body diffusion with the FET, the first inversion-mode varactor, and the second inversion-mode varactor and couples the first tuning terminal and the second tuning terminal to the body terminal.

6. The radio frequency switch of claim 1 further comprising:
   a first accumulation-mode varactor having a third varactor gate terminal coupled to the drain terminal and a third tuning terminal coupled to the source terminal; and
   a second accumulation-mode varactor having a fourth varactor gate terminal coupled to the source terminal and a fourth tuning terminal coupled to the drain terminal.

7. A radio frequency switch comprising a first node, a second node, and a plurality of switch cells that are coupled in series between the first node and the second node wherein each of the plurality of switch cells comprises:
   a field-effect transistor (FET) comprising a drain terminal, a source terminal, a FET gate terminal, and a body terminal; and
   an off-state linearization network comprising:
      a first accumulation-mode varactor having a first varactor gate terminal coupled to the drain terminal and a first tuning terminal coupled to the source terminal;
      a second accumulation-mode varactor having a second varactor gate terminal coupled to the source terminal and a second tuning terminal coupled to the drain terminal; and
      a gate-body switch coupled between the FET gate terminal and the body terminal, wherein the gate-body switch is configured to automatically open when the FET transitions to an on-state that passes a radio frequency signal between the drain terminal and the source terminal and is further configured to automatically close when the FET transitions to an off-state that blocks passage of the radio frequency signal between the drain terminal and the source terminal.

8. A radio frequency switch cell comprising:
   a field-effect transistor (FET) comprising a drain terminal, a source terminal, a FET gate terminal, and a body terminal; and
   an off-state linearization network comprising:
      a first inversion-mode varactor having a first varactor gate terminal coupled to the drain terminal and a first tuning terminal coupled to the body terminal;
      a second inversion-mode varactor having a second varactor gate terminal coupled to the source terminal and a second tuning terminal coupled to the body terminal; and
      a gate-body switch coupled between the FET gate terminal and the body terminal, wherein the gate-body switch is configured to automatically open when the FET transitions to an on-state that passes a radio frequency signal between the drain terminal and the source terminal and is further configured to automatically close when the FET transitions to an off-state that blocks passage of the radio frequency signal between the drain terminal and the source terminal.

9. The radio frequency switch cell of claim 8 wherein the FET, the first inversion-mode varactor, and the second inversion-mode varactor include a shared body diffusion.

10. The radio frequency switch cell of claim 8 wherein the first tuning terminal and the second tuning terminal are coupled directly to the body terminal.

11. The radio frequency switch cell of claim 8 further including a body resistor that couples the first tuning terminal and the second tuning terminal to the body terminal.

12. The radio frequency switch cell of claim 8 further including a body resistor that shares a body diffusion with the FET, the first inversion-mode varactor, and the second inversion-mode varactor and couples the first tuning terminal and the second tuning terminal to the body terminal.

13. The radio frequency switch cell of claim 8 further comprising:

a first accumulation-mode varactor having a third varactor gate terminal coupled to the drain terminal and a third tuning terminal coupled to the source terminal; and a second accumulation-mode varactor having a fourth varactor gate terminal coupled to the source terminal and a fourth tuning terminal coupled to the drain terminal.

14. A radio frequency switch cell comprising:

a field-effect transistor (FET) comprising a drain terminal, a source terminal, a FET gate terminal, and a body terminal; and an off-state linearization network comprising:
- a first accumulation-mode varactor having a first varactor gate terminal coupled to the drain terminal and a first tuning terminal coupled to the source terminal;
- a second accumulation-mode varactor having a second varactor gate terminal coupled to the source terminal and a second tuning terminal coupled to the drain terminal; and
- a gate-body switch coupled between the FET gate terminal and the body terminal, wherein the gate-body switch is configured to automatically open when the FET transitions to an on-state that passes a radio frequency signal between the drain terminal and the source terminal and is further configured to automatically close when the FET transitions to an off-state that blocks passage of the radio frequency signal between the drain terminal and the source terminal.

15. A radio frequency switch comprising a first node, a second node, and a plurality of switch cells that are coupled in series between the first node and the second node wherein each of the plurality of switch cells comprises:

a field-effect transistor (FET) comprising a drain terminal, a source terminal, a FET gate terminal, and a body terminal; and an off-state linearization network comprising:
- a first inversion-mode varactor having a first varactor gate terminal coupled to the drain terminal and a first tuning terminal coupled to the body terminal;
- a second inversion-mode varactor having a second varactor gate terminal coupled to the source terminal and a second tuning terminal coupled to the body terminal;
- a first accumulation-mode varactor having a third varactor gate terminal coupled to the drain terminal and a third tuning terminal coupled to the source terminal;
- a second accumulation-mode varactor having a fourth varactor gate terminal coupled to the source terminal and a fourth tuning terminal coupled to the drain terminal;
- a gate-body switch coupled between the FET gate terminal and the body terminal, wherein the gate-body switch is configured to automatically open when the FET transitions to an on-state that passes a radio frequency signal between the drain terminal and the source terminal and is further configured to automatically close when the FET transitions to an off-state that blocks passage of the radio frequency signal between the drain terminal and the source terminal.

16. The radio frequency switch of claim 15 wherein the FET, the first inversion-mode varactor, and the second inversion-mode varactor include a shared body diffusion.

17. The radio frequency switch of claim 15 further including a body resistor that shares a body diffusion with the FET, the first inversion-mode varactor, and the second inversion-mode varactor and couples the first tuning terminal and the second tuning terminal to the body terminal.

* * * * *